United States Patent
Bokui et al.

(10) Patent No.: US 6,674,330 B2
(45) Date of Patent: Jan. 6, 2004

(54) RECORDING CLOCK GENERATION CIRCUIT

(75) Inventors: Takahiro Bokui, Osaka (JP); Takahiro Ochi, Kyoto (JP); Yoshinori Miyada, Kyoto (JP); Yutaka Murata, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/215,159

(22) Filed: Aug. 8, 2002

(65) Prior Publication Data

US 2003/0067356 A1 Apr. 10, 2003

(30) Foreign Application Priority Data

Oct. 10, 2001 (JP) ........................................ 2001-312141

(51) Int. Cl.$^7$ ................................................ H03L 7/00

(52) U.S. Cl. ................................................ 331/11

(58) Field of Search ................................ 331/10, 11, 14, 331/17, 25, DIG. 2; 327/146, 147, 155, 156; 375/376, 375

(56) References Cited

U.S. PATENT DOCUMENTS

| | | | | |
|---|---|---|---|---|
| 6,118,742 A | * | 9/2000 | Matsui et al. | 369/47.48 |
| 6,236,629 B1 | * | 5/2001 | Hisakado et al. | 369/47.32 |
| 6,489,851 B1 | * | 12/2002 | Miyada et al. | 331/11 |
| 6,542,038 B2 | * | 4/2003 | Nishimura et al. | 331/1 A |
| 6,563,387 B2 | * | 5/2003 | Hirano et al. | 331/11 |

FOREIGN PATENT DOCUMENTS

JP   2000-067434   3/2000

* cited by examiner

Primary Examiner—My-Trang Nuton
(74) Attorney, Agent, or Firm—Renner, Otto, Boisselle & Sklar, LLP

(57) ABSTRACT

A recording clock generation circuit includes a first phase comparator for detecting a phase difference between a wobble signal and a PLL internal signal; a first filter for smoothing an output from the first phase comparator; a VCO circuit for oscillating in accordance with the output smoothed by the first filter; a frequency divider for dividing a frequency of an output from the VCO circuit; a phase adjusting circuit for adjusting a phase of an output from the frequency divider; and a second phase comparator for detecting a phase difference between the wobble signal and a pre-pit signal, and outputting the phase difference to the phase adjusting circuit.

2 Claims, 4 Drawing Sheets

(A) Wobble signal
(B) Recording clock (influenced by crosstalk)
(C) Recording clock (normal state)

RECORDING CLOCK GENERATION CIRCUIT

BACKGROUND OF THE INVENTION

1. Field of the Invention

The present invention relates to a recording clock generation circuit for generating a recording clock signal from a wobble signal which is read from an optical disc or the like which is not influenced by crosstalk between adjacent tracks of the optical disc or the like.

2. Description of the Related Art

A conventional recording clock generation circuit will be described with reference to FIG. 4.

FIG. 4 shows a configuration of a conventional recording clock generation circuit. The conventional recording clock generation circuit includes a first phase comparator 1 for detecting a phase difference between a wobble signal and a PLL (phase-locked loop) internal signal VCOOUT, a first filter 2 for smoothing the output from the first phase comparator 1, a VCO circuit 3 oscillating in accordance with the smoothed signal, and a frequency divider 4 for dividing the frequency of the output from the VCO (voltage controlled oscillator) circuit 3. The first phase comparator 1, the first filter 2, the VCO circuit 3 and the frequency divider 4 form a PLL.

A wobble signal is read from a physical description on a track of an optical disc or the like and used for generating a recording clock.

An output of the first phase comparator 1 is connected to an input of the first filter 2. An output of the first filter 2 is connected to an input of the VCO circuit 3. An output of the VCO circuit 3 is connected to an input of the first phase comparator 1 via the frequency divider 4.

The conventional recording clock generation circuit shown in FIG. 4 operates as follows.

A phase difference between an input wobble signal and a PLL internal signal VCOOUT is detected by the first phase comparator 1 and is smoothed by the first filter 2. The smoothed signal is converted into a signal having a particular frequency by the VCO circuit 3 oscillating in accordance with a value of the input signal. The frequency is input to the first phase comparator 1 via the frequency divider 4. In other words, a feedback operation is performed such that the phase of the input wobble signal and the phase of the PLL internal signal VCOOUT match each other.

In the case where the frequency divider 4 divides the frequency into N, a recording clock is generated at a particular frequency, which is N times the frequency of the PLL internal signal VCOOUT, so as to be in synchronization with the input wobble signal.

However, the conventional recording clock generation circuit having the above-described structure has a problem in that a correct recording clock (or a recording clock synchronized to the input wobble signal) cannot be generated since the input wobble signal itself is shifted in phase due to interference between adjacent tracks of the disc.

FIG. 5 is a timing diagram illustrating the operation of the conventional recording clock generation circuit shown in FIG. 4. Section (A) of FIG. 5 shows a waveform of the wobble signal having a shifted phase due to an influence of crosstalk between adjacent tracks of the disc. When the phase of the wobble signal is shifted as shown in section (A) due to the influence of crosstalk, a recording clock having a shifted phase as shown in section (B) of FIG. 5 is obtained. Section (C) of FIG. 5 shows a recording clock obtained in a normal state, i.e., free from any influence of crosstalk. A chain line a represents normal waveforms.

SUMMARY OF THE INVENTION

A recording clock generation circuit according to the present invention includes a first phase comparator for detecting a phase difference between a wobble signal and a PLL internal signal; a first filter for smoothing an output from the first phase comparator; a VCO circuit for oscillating in accordance with the output smoothed by the first filter; a frequency divider for dividing a frequency of an output from the VCO circuit; a phase adjusting circuit for adjusting a phase of an output from the frequency divider; and a second phase comparator for detecting a phase difference between the wobble signal and a pre-pit signal, and outputting the phase difference to the phase adjusting circuit.

In one embodiment of the invention, the recording clock generation circuit further includes a second filter, provided between the phase adjusting circuit and the second phase comparator, for filtering the phase difference detected by the second phase comparator.

Thus, the invention described herein makes possible the advantages of providing a recording clock generation circuit for generating a recording clock signal which is not influenced by crosstalk.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
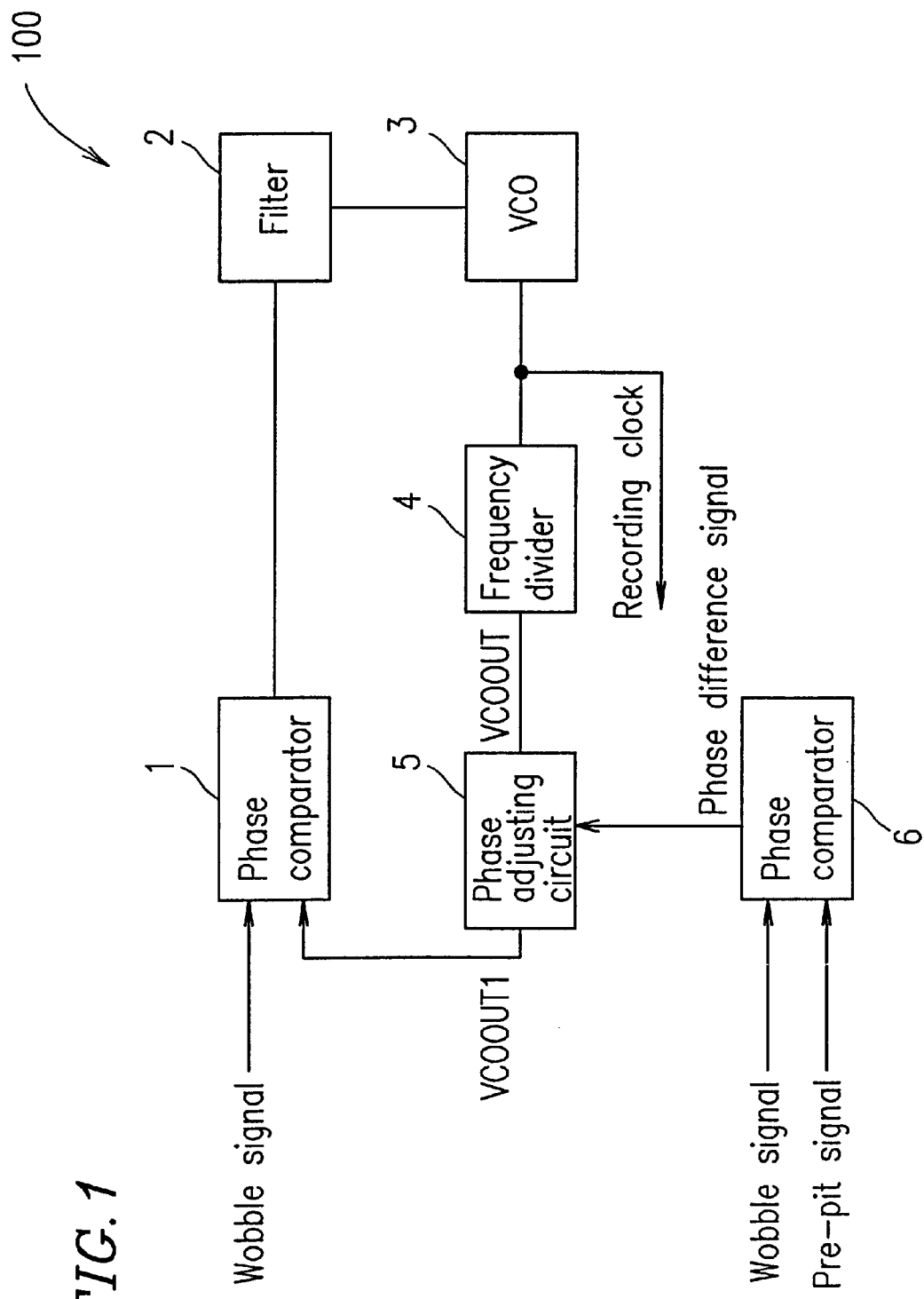
FIG. 1 shows a configuration of a recording clock generation circuit according to a first example of the present invention.

FIG. 1 shows a configuration of a recording clock generation circuit 100 according to a first example of the present invention.

The recording clock generation circuit 100 includes a first phase comparator 1 for detecting a phase difference between a wobble signal and a PLL internal signal VCOOUT, a first filter 2 for smoothing an output from the first phase comparator 1, a VCO circuit 3 oscillating in accordance with the smoothed signal, a frequency divider 4 for dividing the frequency of the output from the VCO circuit 3, a phase adjusting circuit 5 for shifting the phase of the frequency-divided PLL internal signal VCOOUT output from the frequency divider 4, and a second phase comparator 6 for detecting a phase difference between the wobble signal and a pre-pit signal. The pre-pit signal represents phase information which is written on the disc.

An output of the first phase comparator 1 is connected to an input of the first filter 2. An output of the first filter 2 is connected to an input of the VCO circuit 3. An output of the VCO circuit 3 is connected to an input of the frequency divider 4. An output of the frequency divider 4 is connected to an input of the first phase comparator 1 via the phase adjusting circuit 5. The phase adjusting circuit 5 is also connected to an output of the second phase comparator 6. The first phase comparator 1, the first filter 2, the VCO circuit 3, the frequency divider 4 and the phase adjusting circuit 5 form a PLL.

The recording clock generation circuit 100 operates as follows.

A phase difference between an input wobble signal and a PLL internal signal VCOOUT1 is detected by the first phase comparator 1 and is smoothed by the first filter 2. The smoothed signal is converted into a signal having a particular frequency by the VCO circuit 3 oscillating in accordance with a value of the input signal. The frequency is divided by the frequency divider 4, phase-adjusted by the phase adjusting circuit 5, and then is returned to the first phase comparator 1. The phase adjusting circuit 5 also receives a phase difference signal from the second phase comparator 6. The phase difference signal sent from the second phase comparator 6 represents a phase difference between the wobble signal and a pre-pit signal. The phase difference signal is detected by the second phase comparator 6.

Figure 2:
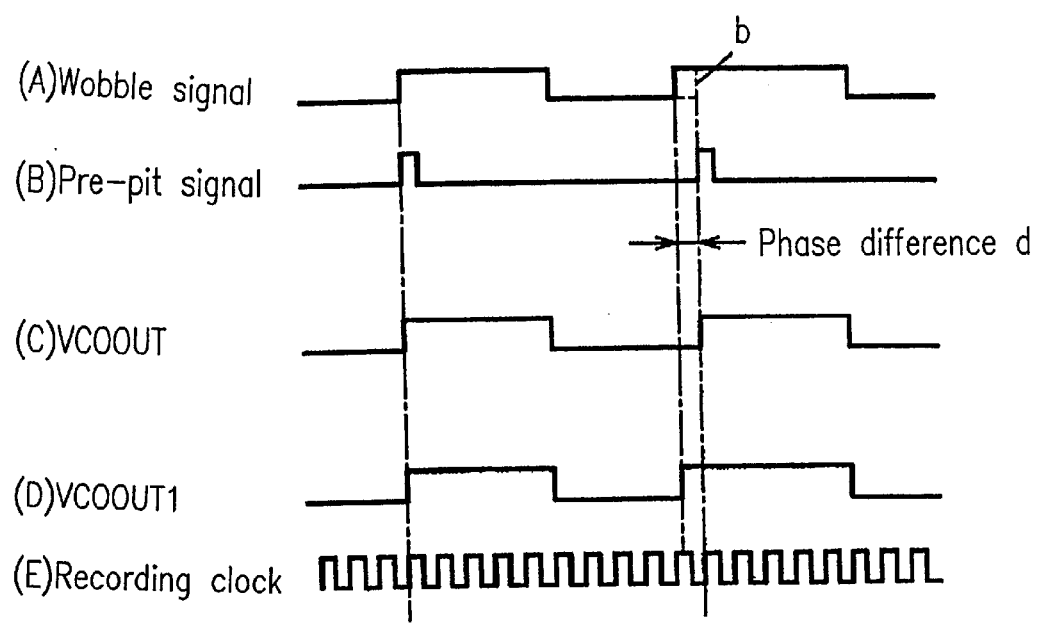
FIG. 2 is a timing diagram illustrating an operation of the recording clock generation circuit shown in FIG. 1.

FIG. 2 is a timing diagram illustrating the operation of the recording clock generation circuit 100 shown in FIG. 1. Section (A) of FIG. 2 shows a waveform of the wobble signal having a shifted phase due to an influence of crosstalk between adjacent tracks of the disc. Section (B) of FIG. 2 shows a waveform of a pre-pit signal representing correct phase information.

The second phase comparator 6 (FIG. 1) detects a phase difference between the wobble signal having the shifted phase and the pre-pit signal representing the correct phase information. In FIG. 2, the detected phase difference is represented by letter d. Then, the phase adjusting circuit 5 shifts the phase of the frequency-divided signal VCOOUT (section (C) of FIG. 2) by phase difference d, so as to generate a signal VCOOUT1 (section (D) of FIG. 2). The generated signal VCOOUT1 is sent to the first phase comparator 1. A chain line b represents normal waveforms. In the above-described manner, a correct recording clock can be generated even when the wobble signal is shifted in phase due to an influence of crosstalk.

As described above, in the first example of the present invention, the recording clock generation circuit 100 includes the second phase comparator 6 and the phase adjusting circuit 5. Owing to such a structure, a phase difference between an input wobble signal and a pre-pit signal is detected, and the phase of the frequency-divided signal VCOOUT is shifted in accordance with the detection result. As a result, the recording clock generation circuit 100 generates a correct recording clock which is not influenced by crosstalk.

In the first example, the frequency divider 4 and the phase adjusting circuit 5 are provided as separate circuits. Alternatively, the frequency divider 4 and the phase adjusting circuit 5 may be provided as one circuit block. A recording clock cannot be generated from a pre-pit signal since the pre-pit signal appears at a rate of one per eight cycles of the wobble signal.

EXAMPLE 2

Figure 3:
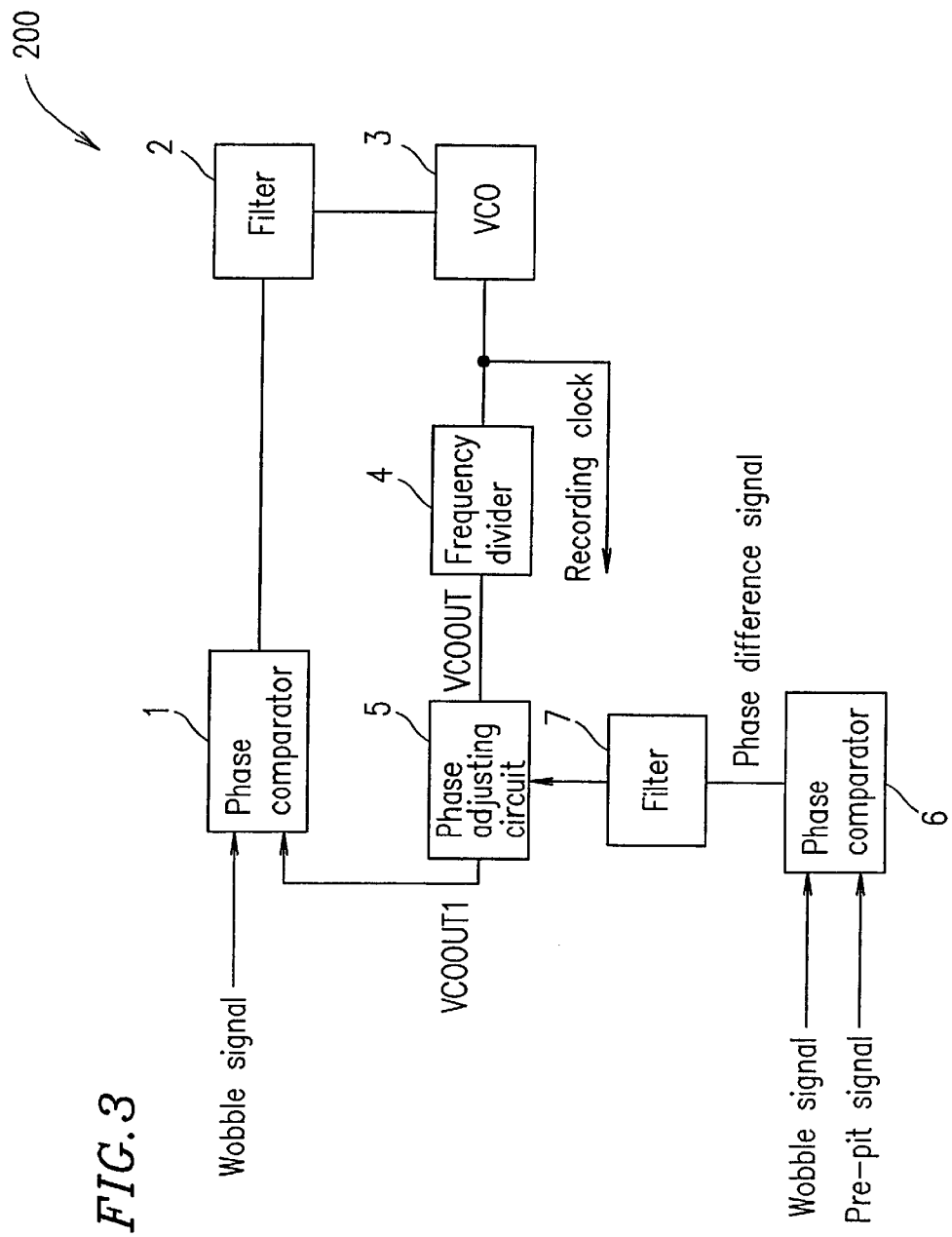
FIG. 3 shows a configuration of a recording clock generation circuit according to a second example of the present invention.
Figure 4:
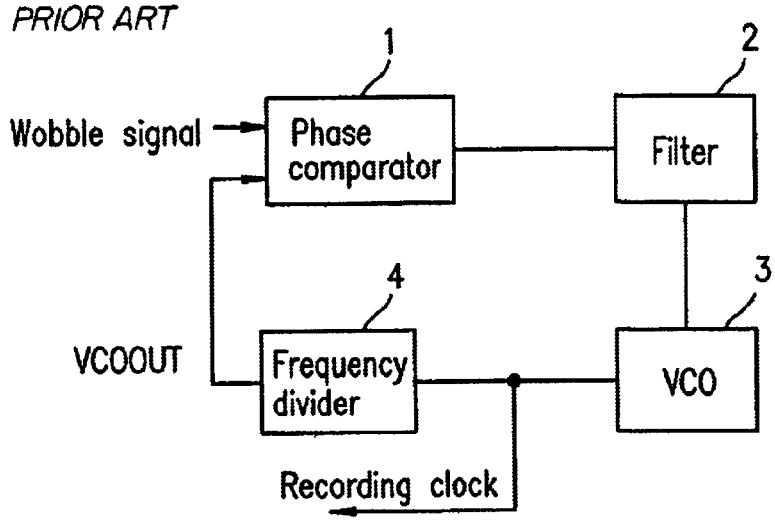
FIG. 4 shows a configuration of a conventional recording clock generation circuit.
Figure 5:
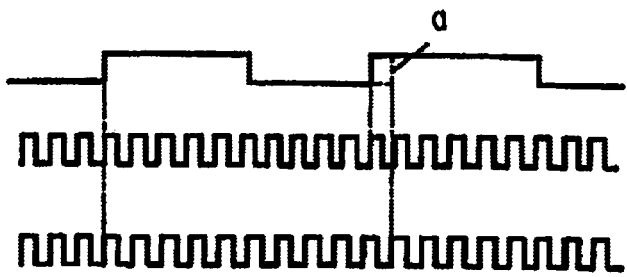
FIG. 5 is a timing diagram illustrating an operation of the conventional recording clock generation circuit shown in FIG. 4.

FIG. 3 shows a configuration of a recording clock generation circuit 200 according to a second example of the present invention. In the recording clock generation circuit 200, the output of the second phase comparator 6 is input to the phase adjusting circuit 5 via a second filter 7. Except for this, the configuration of the recording clock generation circuit 200 is substantially the same as that of the recording clock generation circuit 100 in the first example. The second filter 7 may be, for example, a low-pass filter.

In operation, the second phase comparator 6 detects a phase difference between the wobble signal having the shifted phase and a pre-pit signal representing correct phase information. The detected phase difference is filtered by the second filter 7 and then sent to the phase adjusting circuit 5. Except for this, the recording clock generation circuit 200 operates in substantially the same manner as that of the recording clock generation circuit 100. The recording clock which is generated by the recording clock generation circuit 200 is of the same form as that of the recording clock generated by the recording clock generation circuit 100.

The reason for providing the second filter 7 is as follows. When the phase difference between a wobble signal and a pre-pit signal drastically changes, the generation of a recording clock may be destabilized, and in an extreme case, the feedback loop may be unlocked. In the recording clock generation circuit 200 in the second example, the phase difference detected by the second phase comparator 6 is filtered by the second filter 7 and is then output to the phase adjusting circuit 5.

Owing to such an operation, the excessively drastic change in the phase difference can be alleviated. Thus, in the second example of the present invention, even when the phase difference between a wobble signal and a pre-pit signal changes drastically, the operation of the recording clock generation circuit 200 is not destabilized. Thus, the feedback loop of the recording clock generation circuit 200 is prevented from being unlocked under any conditions.

According to the present invention, a second phase comparator, additional to that provided conventionally, detects a phase difference between a wobble signal and a pre-pit signal, and a phase adjusting circuit shifts the phase of an output from the frequency divider in accordance with the detection result. Thus, a recording clock generation circuit according to the present invention generates a correct recording clock free from interference between adjacent tracks of a disc from which the wobble signal is read.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A recording clock generation circuit, comprising:
  a first phase comparator for detecting a phase difference between a wobble signal and a PLL internal signal;
  a first filter for smoothing an output from the first phase comparator:
  a VCO circuit for oscillating in accordance with the output smoothed by the first filter;
  a frequency divider for dividing a frequency of an output from the VCO circuit;

a phase adjusting circuit for adjusting a phase of an output from the frequency divider and providing the PLL internal signal based thereon; and a second phase comparator for detecting a phase difference between the wobble signal and a pre-pit signal, and outputting the phase difference to the phase adjusting circuit.

2. A recording clock generation circuit according to claim 1, further comprising a second filter, provided between the phase adjusting circuit and the second phase comparator, for filtering the phase difference detected by the second phase comparator.

* * * * *